(12) United States Patent
Mitchell

(10) Patent No.: US 6,662,119 B1
(45) Date of Patent: Dec. 9, 2003

(54) METHOD AND APPARATUS FOR MONITORING CONNECTOR DEGRADATION

(75) Inventor: Craig G. Mitchell, South Barrington, IL (US)

(73) Assignee: 3Com Corporation, Rolling Meadows, IL (US)

(*) Notice: Subject to any disclaimer, the term of this patent is extended or adjusted under 35 U.S.C. 154(b) by 0 days.

(21) Appl. No.: 10/211,754

(22) Filed: Aug. 2, 2002

(51) Int. Cl.[7] .......................... G06F 19/00; G06F 17/40
(52) U.S. Cl. ..................... 702/34; 702/187; 710/301; 710/302
(58) Field of Search .................. 702/34, 187; 710/301, 710/302; 361/773, 774, 788

(56) References Cited

U.S. PATENT DOCUMENTS

| | | | |
|---|---|---|---|
| 6,062,480 A | * | 5/2000 | Evoy .......................... 235/492 |
| 6,175,507 B1 | | 1/2001 | Koradia et al. |
| 6,239,984 B1 | | 5/2001 | Koradia et al. |
| 6,263,386 B1 | * | 7/2001 | Sanders ....................... 710/301 |
| 2002/0118480 A1 | * | 8/2002 | Rochat et al. ................. 360/69 |

* cited by examiner

Primary Examiner—Marc S. Hoff
Assistant Examiner—Andrew Morris
(74) Attorney, Agent, or Firm—Baniak Pine & Gannon

(57) ABSTRACT

A line card connectable to a backplane connector includes a connector. The connector includes connector terminals, a subset of which are connected to an insertion monitoring circuit. The insertion monitoring circuit includes a power conductor connected to a first terminal of the subset. One or more pull up resistors are connected to the power conductor. One or more sense lines are connected to one or more second terminals of the subset. The first terminal is positioned on the card so as to be connectable to the backplane connector before the one or more second terminals. An insertion detection device is provided for detecting an insertion of the card. A state device is connected to the insertion detection device for calculating a primary insertion count from the detection of the insertion and a non-volatile memory device is connected to the state device for storing the primary insertion count.

24 Claims, 2 Drawing Sheets

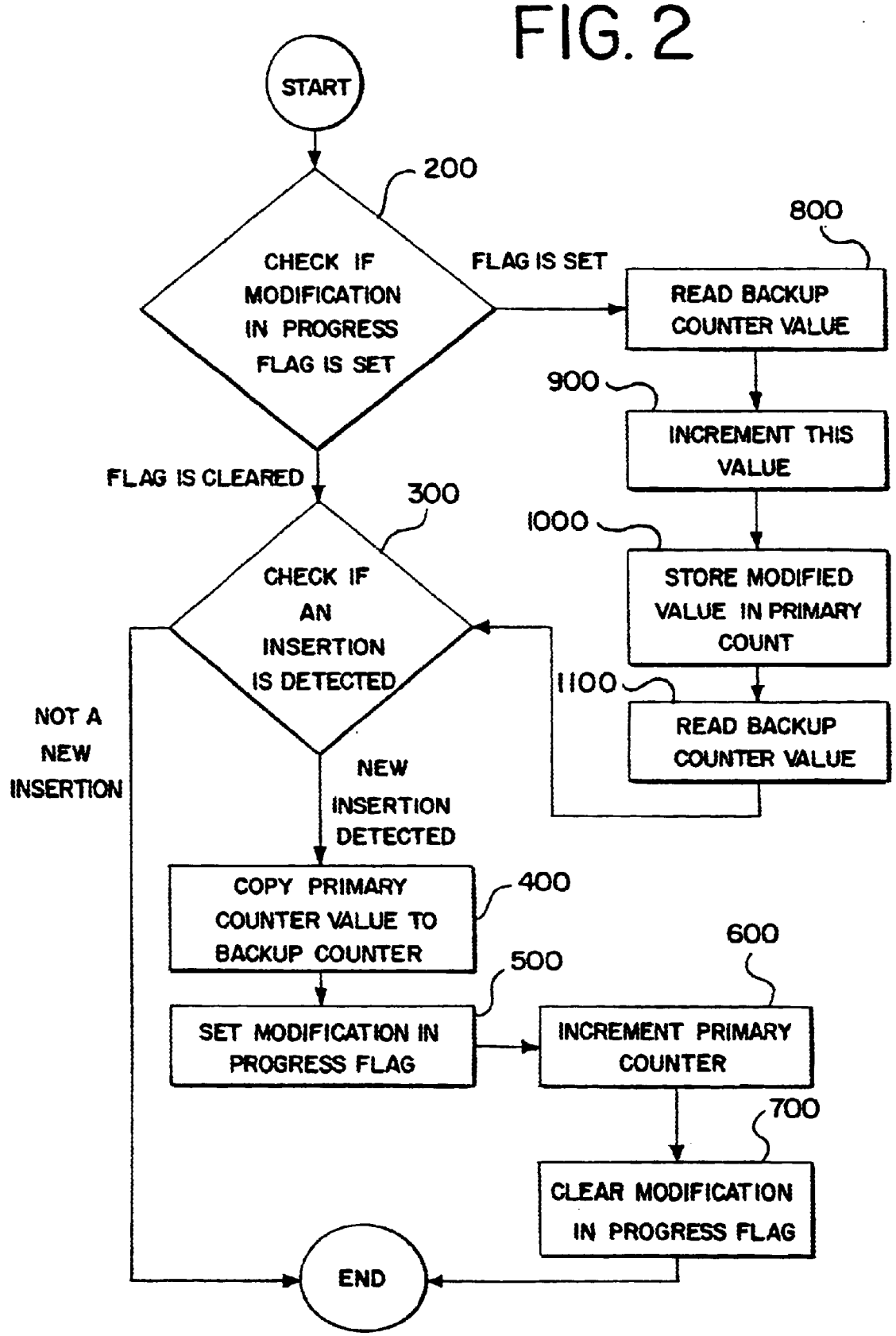

METHOD AND APPARATUS FOR MONITORING CONNECTOR DEGRADATION

FIELD OF THE INVENTION

This invention relates generally to the field of electronic chassis that house electronic components to be used in, as an example, high-speed telecommunication and networking applications. In particular, the present invention relates to a method and apparatus for monitoring electrical connector degradation in such an electronic chassis by counting the number of insertions experienced by a circuit board to a backplane connector or the like.

BACKGROUND OF THE INVENTION

An electronic chassis that houses electronic components for high-speed telecommunication and networking applications typically includes a plurality of circuit board assemblies. Some of these circuit boards may be referred to as application cards and perform various functions such as digital signal processing. These chassis are often referred to as a high availability platform due to the fact that the chassis are designed for continuous operation. Individual application cards may be inserted and removed for maintenance and other reasons.

The chassis includes a backplane circuit board including various connectors typically fastened to the pair of card guide assemblies. The backplane circuit board forms the back wall of the chassis. When the application cards are inserted into the chassis they are guided into the chassis along a pair of card guide assemblies mounted between the sidewalls of the chassis. One of the card guide assemblies is typically located adjacent the top of the chassis and the other is typically located adjacent the bottom of the chassis. When fully inserted into the chassis, connectors located along the back edge of the application cards are connected to the connectors located on the backplane circuit board. These connectors may be referred to as backplane connectors.

While a variety of electrical backplane connectors are known in the art, all such connectors interconnect circuit boards to a backplane or motherboard to daughterboard. For purposes of this application, backplane connectors will be considered to include a male portion including a plurality of conductive pins or the like, which conduct electrical power or signals. A female portion is typically associated with the application card. The female portion is sized and shaped to receive the male portion while providing proper alignment of the two portions and providing electrical connection with the pins. Other arrangements of the connector portions are contemplated.

As connection densities increase there is an increasing focus on providing a reliable manner of interconnecting a large number of densely organized printed circuit board pads to a connector of minimal size while still providing a high degree of reliability. These types of connectors may suffer failures or reduced reliability resulting from stresses applied to the connectors from insertion and removal of the printed circuit board.

Such electrical connectors often specify useful life expectancy in terms of the number of mates that can be made reliably. Accordingly, there is a demand for a method and apparatus to monitor the degradation of backplane connectors by generating and providing insertion information, such as an insertion count (mates) to a management entity. The present invention satisfies this demand.

SUMMARY OF THE INVENTION

It is an object of the present invention to generate and provide insertion count information with respect to chassis based platforms or like systems where a large number of densely organized printed circuit boards or application cards are employed and connected to the host system by backplane connectors, for example. In such a system, for maintenance and other purposes, the cards may be removed from the backplane connector a number of times during the lifecycle of the card. In order to monitor the effective remaining useful life of an individual connector on the card, it is an object of the invention to generate, store and report data related to the number of times that a particular card has been removed and inserted into the slot of the backplane connector.

Briefly, the invention relies on an insertion monitor circuit to indicate a connector mate. During the power up sequence of an application card, the insertion monitor makes use of physically staggered terminals or pins on an application card being connected to a backplane connector in a specified mating sequence to identify an insertion event. The staggered arrangement of pins guarantees the mating sequence in a predetermined order.

With respect to the insertion monitor circuit, in one embodiment of the invention, hardware resource bus (HRB) power pin(s) make electrical connection to a backplane connector prior to a single sense line. It may be assumed in this embodiment that a digital ground is already connected. In another embodiment, the HRB pin makes electrical connection to a backplane connector prior to two sense lines. In this embodiment, both sense lines must be grounded before the sequence is completed. This sequence first provides power to the insertion monitor circuit and provides voltage to sense resistor pull-ups of the card. Subsequent to contact of the HRB pins, one or more sense pin is mated to the backplane connector. As a result, the sense pins are grounded on the backplane. This causes the circuit to transition from a high voltage to a low voltage. This transition from a high state to a low state is detected by the circuit and used to indicate an insertion.

Either a single sense line may be used or a combination of two or more spaced sense lines. In the event that two independent sense lines are used, the lines are physically spaced on opposite ends of the card so as to ensure complete seating of the card with the connector before the insertion detection occurs. In this case, both sense lines are required to become grounded before the circuit completes the transition and an insertion count is subsequently incremented. Further, a debounce circuit, as known in the art, may be used to reduce errors during mating of the card. The debounce circuit is used to produce a single transition of the state of the card when inserting the card. Without a debounce circuit, it is possible to see multiple transitions on the insertion detection circuit. Debouncing is common when interfacing electronics to mechanical systems. In one example of a debounce circuit, a timer is used, which requires that both sense lines are grounded for a predetermined length of time before subsequent next steps occur in the process of indicating an insertion.

In the event that the insertion detection device detects a transition from a high state to a low state, a state device reads the contents of a non-volatile storage device (for example, EPROM, EEPROM and FLASH) to obtain the current insertion count value, updates the insertion count value by incrementally adding to the count value and writes the updated incremented count value to the non-volatile storage device.

It will be understood that the insertion detection circuit may include a hardware device or a combination of hardware and software. One example of a hardware device around which the insertion detection circuit may be implemented is a programmable logic device (PLD).

The advantage of using staggered terminals or pins is that the resulting sequence allows for differentiation between card insertion, and chassis power up. While it is assumed that a high-availability chassis is rarely powered off, the act of powering a chassis on and off will not be counted as an insertion event if the staggered pins are used to sense insertion. This is because after insertion, the sense lines are already mated to the connector when the chassis is powered off. When the chassis is subsequently powered up, the backplane holds the insertion sense lines low, and a transition from a high state is not seen on the sense lines or detected by the insertion detection circuit. Accordingly, no change in status is noted and an insertion count is not incremented.

In one embodiment of the invention, an insertion detection/state device/EEPROM can all be powered off hardware resource bus (HRB) power, or segmented so that only the insertion detection is powered by the HRB. This could be done if the state device was implemented in software. Such an embodiment assumes the user does not insert and remove application cards and the like from the chassis while the chassis is un-powered.

In another embodiment of the invention, a power source separate from the power supplied by the chassis, such as a battery or a charged capacitor (or a combination thereof) is positioned on the card to provide a power source independent from the chassis power. The independent power source provides the power to maintain the card at a high state even when the card is separate from a chassis. When the card is inserted, the card is grounded and the circuit transitions to a discharged (low) state and as a result the counter is incremented even if the chassis is powered off.

One aspect of the present invention provides a card monitoring apparatus for detecting and incrementing insertion counts of an application card to a backplane connector including a card connector positioned on the application card including connector terminals sized and shaped to be connected to the backplane connector. An insertion monitoring circuit is connected to a subset of the connector terminals for detecting an insertion of the application card into the backplane connector and generating and storing an insertion count therefrom.

Other aspects of the present invention provide a subset of connector terminals that may include a first conductor positioned on the application card for providing power to at least the insertion monitoring circuit and a second conductor positioned on the application card. The second conductor is electrically connected to the insertion monitoring circuit wherein the first conductor and the second conductor are offset with respect to each other such that during connection of the card connector to the backplane connector an insertion sequence is performed wherein the first conductor makes electrical contact or mates with the backplane connector before the second conductor. The insertion sequence is detected by the insertion monitoring circuit, which generates an incremental increase in the insertion count.

The monitoring circuit may include an insertion detection device for detecting the insertion of the card connector into the backplane connector. The insertion detection device may generate an insertion signal when an insertion is detected. The insertion monitoring circuit may include a state device connected to the insertion detection device for receiving the insertion signal and performing an update of the insertion count thereby. The insertion detection circuit may include a non-volatile memory device connected to the state device. The insertion count may be stored in the non-volatile memory device. The second conductor may include a first sense line and a second sense line. The card monitoring apparatus may further include one or more pull up resistors connected to the first conductor. The insertion detection device may include a multi-input OR gate with each OR gate input connected to a corresponding one of the first and second sense lines. The OR gate includes binary output corresponding to a first state indicating a high voltage in one of the first and second sense lines and a second state indicating a low voltage in the first and second sense lines. The first conductor may be a hardware resource bus terminal.

In the alternate, it will be appreciated that an AND gate may be substituted for the OR gate, whereupon only one of the first and second sense lines would be required to transition from a high state to a low state for the circuit to detect an insertion.

Another aspect of the present invention provides a line card for use in a high availability chassis connectable thereto by a backplane connector including a connector sized and shaped to connect to the backplane connector. The connector includes a plurality of connector terminals for transmitting electrical power and electrical signals, a subset of the plurality of connector terminals being connected to an insertion monitoring circuit of the line card. The insertion monitoring circuit includes a power conductor connected to a first terminal of the subset. One or more pull up resistors are connected to the power conductor. One or more sense lines are connected to respective one or more second terminals of the subset. The first terminal is positioned on the line card so as to be connectable to the backplane connector before the one or more second terminals. An insertion detection device is provided for detecting an insertion of the line card. A state device is connected to the insertion detection device for calculating a primary insertion count from the detection of the insertion and a non-volatile memory device is connected to the state device for storing the primary insertion count.

Other aspects of the present invention provide pull up resistors for holding the insertion monitoring circuit in a high state when the first terminal is inserted into the backplane connector. The one or more sense lines may permit the insertion monitoring circuit to transition to a low state when both of the one or more sense lines are inserted into the backplane connector. The insertion detection device may detect the transition from the high state to the low state and generates an insertion signal therefrom. The state device receives the insertion signal from the insertion detection device, reads a stored primary insertion count from the non-volatile memory device, incrementally increases the primary insertion count to produce an updated primary insertion count and writes the updated primary insertion count to the non-volatile memory device.

Another aspect of the present invention provides a system for monitoring the connection of an application card to a backplane connector of a host system, including a male connector connected to the host system. A female connector is provided to the application card and is sized and shaped to connect to the male connector. An insertion detection device is connected to the female connector for detecting an insertion connection between the female connector and the male connector and generating and storing an insertion count therefrom. A plurality of conductive terminals extend from the female connector for electrical communication with the backplane connector including a first conductor positioned on the application card for providing power to at least the insertion detection device and a second conductor positioned on the application card electrically connected to the insertion detection device. The first conductor and the second conductor are offset with respect to each other such that during mating of the application card to the backplane connector an insertion sequence is performed wherein the first conductor connects to the backplane connector before the second conductor. The insertion sequence causes an incremental increase in the insertion count.

Another aspect of the present invention provides a card monitoring apparatus for detecting and incrementing insertion counts of a line card to a backplane connector in a host system including a card connector positioned on the line card including connector terminals sized and shaped to be connected to the backplane connector and an insertion detection circuit connected to a subset of the connector terminals for detecting an insertion of the application card into the backplane connector and calculating and storing an insertion count therefrom.

Another aspect of the present invention provides a host system including a plurality of line cards. Each of the plurality of line cards includes a monitoring apparatus for detecting and incrementing insertion counts to one of a plurality of backplane connectors of a high availability chassis of the host system. Each of the plurality of line cards includes a card connector with connector terminals sized and shaped to be operably connected to one of the plurality of backplane connectors. The monitoring apparatus includes an insertion detection circuit connected to a subset of the connector terminals for detecting an insertion of a corresponding one of the plurality of line cards with one of the plurality of backplane connectors and determining and storing an insertion count therefrom.

Another aspect of the present provides a method of monitoring an insertion count of a line card to a backplane connector including providing the line card with an insertion monitoring circuit for detecting, incrementing and storing the insertion count. A first terminal of the insertion monitoring circuit is connected to the backplane connector to produce a high state. A second terminal, which may be two independent terminals, of the insertion monitoring circuit is connected to the backplane connector to transition the high state to a low state. The transition to the low state is detected. A current primary insertion count is retrieved in response to the detection of the transition. The current primary insertion count is incremented to produce an updated primary insertion count and the updated primary insertion count is stored as the current primary insertion count.

Further aspects of the method of the present invention may include providing the current primary insertion count to a management entity for monitoring purposes. The line card insertion monitoring circuit may be provided with an error detection and correction device and method.

In an alternate embodiment, and using the same set of staggered pins and electronic components as set forth herein, the same objective of incrementing an insertion count can be accomplished during removal of an application card. In this embodiment, it is contemplated that the detection device can be provided the capability of detecting an insertion by monitoring the sense lines. In the event that the value of the sense lines transitions from a low to a high value, the counter is incrementally increased. It will be appreciated that this must be done before the card loses power. In the alternate, the card may be provided with an onboard power source, such as a battery or capacitor or a combination thereof, for powering the components which detect, and increment the insertion count.

The invention provides the foregoing and other features, and the advantages of the invention will become further apparent from the following detailed description of the presently preferred embodiments, read in conjunction with the accompanying drawings. The detailed description and drawings are merely illustrative of the invention and do not limit the scope of the invention, which is defined by the appended claims and equivalents thereof.

BRIEF DESCRIPTION OF THE DRAWINGS

FIG. 2 is a flowchart of one embodiment of a process of generating a record of the number of insertions of an application card made to a backplane connector including error correction.

DETAILED DESCRIPTION OF THE PRESENTLY PREFERRED EMBODIMENTS

Figure 1:
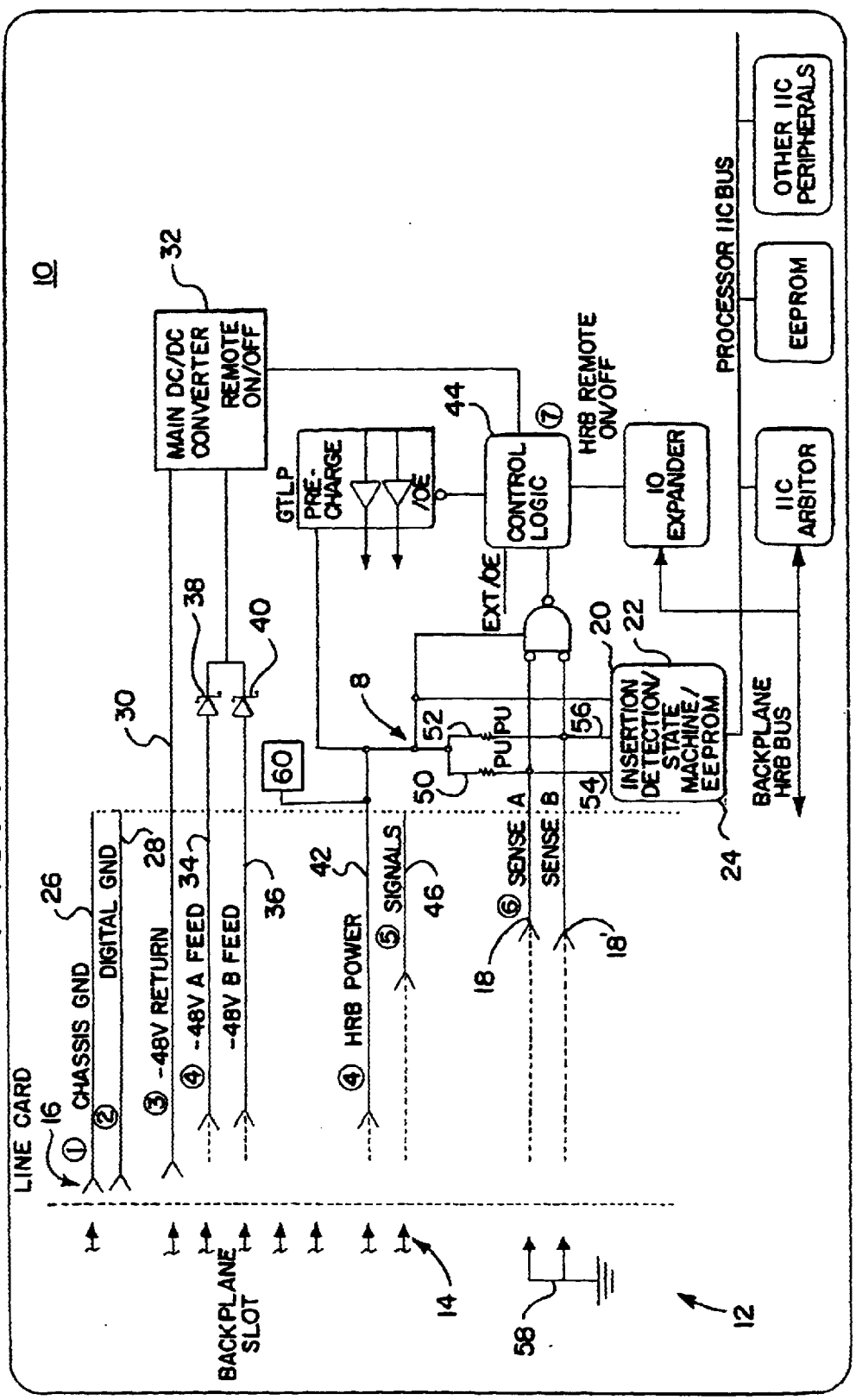
FIG. 1 is a generalized diagram of an electrical block schematic of a application card including one embodiment of an insertion detection and counter apparatus for monitoring the number of insertions made to a backplane connector.

The following description of the present invention is set forth in reference to a popular standard printed circuit board connector for the purpose of illustrating the invention. It will be understood by those practicing the art that the invention is applicable to a broad range of board connectors used in various host systems. Accordingly, the present invention is not intended to be limited to use in host systems using backplane connectors.

The invention may be applied to a high availability multiservice access platform for IP-based multimedia services. The platform may include a high-availability chassis including a plurality of individual digital signal processing "DSP" cards. The invention may be utilized in such a platform, for example, to assist in the monitoring and management of the interconnection between the cards and the system through backplane connectors.

For the purpose of illustrating a system (e.g., a Total Control 2000, manufactured by CommWorks, a 3Com Company, not shown) in which the invention would be of particular utility, the chassis may include a plurality of shelves. A single shelf can host as many as 14 DSP cards, each with a DS-3 PSTN interface, each card being connected thereto by backplane connectors. Each shelf may contain a plurality of slots, for example, eighteen slots: Two slots are provided for control modules (e.g., shelf controller cards), two slots may be provided for packet switch egress modules and fourteen slots for application modules (e.g., DSP cards). Each of the cards may include the insertion detection circuit of the present invention. As noted above, it will be understood that the illustrations provided herein are exemplary in nature and not limiting.

As shown in FIG. 1, one embodiment of the insertion monitoring circuit or apparatus 8 of the present invention is applied to a card 10 (e.g., a digital signal processing "DSP" card, line card or application card, for example), for monitoring the number of insertions of the card into a backplane connector 12. It will be understood that the cards may be any type of application card. For purposes of the present application, the backplane connector may be a conventional backplane connector that includes a plurality of receptacles 16, which are electrically connected to a host electrical power source, ground source or signal source as will be explained more fully below. The backplane connector 12 may be, for example, a Metral connector from FCI Connectors (see fciconnect.com).

As indicated in FIG. 1, pins 14 on the backplane 12 are provided in a variety of different physical lengths allowing for sequential mating of selected pins during the inserting of the application card into backplane connector. As shown in the illustration, the pins 14 of the embodiment shown are arranged in six different lengths. It will be understood that connector pin layouts and the number of lengths thereof may be different according to design and operational specifications without departing from the spirit of the invention. One or more sense pins 18, 18' are provided on each card 10, which permits an insertion detection device or portion 20 of the circuit 8 to detect a transition from a predetermined high state (of voltage) to a low state. The insertion detection device 20 detects the transition and a state device 22 retrieves a current increment count and calculates and writes an incremental increase in an insertion count to a nonvolatile storage device 24.

As the application card 10 is inserted into the backplane connector 12, a sequential mating of the card to the connector occurs. The first level of mating is considered to be the first ground 26, which is connected to ground when connected to the connector 12. The first ground conductor 26 is positioned to connect before any other conductors 16 and may be considered a safety ground. As mentioned above, the mating elements 16 on the card 10 may include pins, blades or any suitable conductors compatible with the receptacles 16 in the backplane connector 12.

The second level is the digital ground 28. The digital ground 28 is positioned with respect to the first ground conductor 26 to become electrically connected after the first ground conductor. The digital ground 28 is the reference voltage for the digital logic on the board. The HRB voltages, and voltages of the insertion detection logic, are measured in reference to this ground.

The third level of mating includes the eventual application of power to the card 10, in part provided by way of a first return 30, which permits power application to a main DC/DC converter 32 on the card 10. The third level application may also be or include a soft start or soft start pre-charge process.

The fourth level of mating is the direct application of power provided to the DC/DC converter 32 on the card 10 by way of a first feed 34 (e.g., −48 volts) and a second feed 36 (e.g., −48 volts) through first and second diodes 38, 40 respectively. The return 30 and first and second feed 34, 36 contacts may be considered redundant and configured such that the return 30 makes electrical connection to the slot 12 after the digital ground 28 and before the first and second feeds 34, 36.

The fourth level of mating further includes connection of a hardware resource bus (HRB) 42. The HRB 42 provides power to a number of hardware elements on the card 10 including a logic module 44, an insertion detection/state device 20, 22, a non-volatile memory device 24, and so on, as will be explained more fully below.

The fifth level of mating implements the connection of the actual bus signals 46. As shown, the bus signal contact 46 makes electrical contact with the connector 12 after the HRB 42 is powered. This pin 46 represents generically all signal input/output (I/O) pins that may be provided for operation of the card 10.

The sixth level of mating is connection of the first and second sense contacts or pins 18, 18'. First and second sense pins 18, 18' are provided on the card 10 and positioned such that contact of these pins is made after all other pins or contacts make connection with the slot 12. In an alternate embodiment of the invention, the sense contacts 18, 18' are inserted after the ground 26, 28 and power traces 30, 34, 36 during insertion of the card 10 into the backplane connector 12. The first sense contact 18 may be positioned at one end of the card female connector portion. The second sense contact 18' may be positioned at an opposite end of the card 10 with respect to the first sense contact 18.

The card 10 is provided with a device 20, 22 and 24 to provide an indication to a host system (not shown) with a current insertion count. The monitoring device includes the insertion monitor circuit 8 shown in FIG. 1.

The insertion monitor circuit 8 generally includes the HRB lead 42, first and second pull-up resistors 50, 52, first and second sense lines 18, 18' and an insertion detection/state device or module 20, 22. The HRB lead 42 is connected to both the first and second pull-up resistors 50, 52. The first pull-up resistor 50 is connected to both the first sense line 18 and a first input 54 of the insertion detection/state module 20, 22. The second pull-up resistor 52 is connected to both the second sense line 18' and a second input 56 of the insertion detection/state module 20, 22. While it may be required only that one of the first and second sense lines 18, 18' be connected to ground receptacles 58 in order for the circuit 8 to transition from a high state to a low state, it is preferred that both lines transition to provide an indication that the card is fully seated. In response to the transition an insertion detection device 20 of the insertion detection/state module 20, 22 detects an insertion and outputs a signal indicating an insertion to the state device 22.

During insertion of the card 10 into a powered chassis, the HRB pin 42 becomes electrically connected to the connector 12. As a result, the circuit 8 is brought to a high state (voltage potential relatively high with respect to digital ground). When the card 10 is fully seated and one or both of the first and second sense pins 18, 18' are engaged, and thus, grounded, the state of the circuit 8 transitions to low (voltage potential at zero). As a result, the insertion detection device 20 registers an insertion. The insertion detection device 20 signals the insertion to a state device 22 (which may be a part of the same programmable logic device (PLD) or a separate PLD as that of the insertion detection device). The state device 24 reads the contents of the EEPROM 24, which has stored therein a current insertion count value, incrementally increases the count value and writes the updated (increased) count value back to the EEPROM 24. In this manner, the insertion count value is obtained and maintained. The insertion count value may be provided to or accessed by a management entity (such as the shelf controller or another management aspect, not shown, of the host) for monitoring thereby.

In an alternate embodiment, a power source 60 is provided onboard the card 10. The power source 60 may be a battery, or like device, or a capacitor or a combination thereof that holds the insertion monitoring circuit 8 in a high state until such time that the card 10 is inserted into a connector 12 and the sense lines 18, 18' are connected to ground receptacle 58. As before, when the circuit 8 transitions from a predetermined high state to a low state after full insertion, the insertion detection device 20 produces a signal indicating an insertion of the card 10. By providing the onboard power source, the card 10 will detect an insertion even when inserted into an un-powered chassis.

The insertion detection/state module 20, 22 includes hardware in a hardware only implementation and optionally may include software to detect an insertion and incrementally update an insertion count in a non-volatile storage element 24, such as an EEPROM. In a mixed hardware software implementation, the insertion detection/state module would partition the functionality so that the insertion detection would be hardware based. The reading and writing of the EEPROM and error detection could be in software. This software could reside in either a dedicated processor (not shown), on the main processor (not shown, but connected to the processor IIC bus), or on a management entity on a different card in the chassis (not shown).

The EEPROM may be used to store a variety of information, but with respect to the present invention is used to store a primary counter value, i.e., a number of times that the card is inserted into a backplane connector 12 and a backup counter value. Further, the EEPROM 24 is used to store information regarding indicator flags for error correction.

In operation of the system a process is provided using an indicator flag as is known in the art, to determine if the process of updating the count value of an individual application card 10 has been corrupted, interrupted, or if an error has otherwise been introduced. Referring to FIG. 2, on power up of the card 10, the non-volatile storage device 24 is polled to determine if a modification in progress flag is set (Block 200). The modification in progress flag is set each time the card insertion monitoring circuit 8 is powered up or transitions from a low state to a high state by being inserted into a powered chassis, for example. The modification in progress flag is an indicator flag. It is used for error recovery in the event that something catastrophic has occurred, (e.g., power loss, card removal) during the previous power up of the card 10. This flag is stored in non-volatile storage.

If the flag is cleared, the circuit 8 determines if the card 10 has been newly inserted (Block 300). If the circuit 8 determines that the card 10 has not been newly inserted the insertion count is therefore not incremented and no action is taken, i.e., the process comes to an end.

If the insertion detection device 20 indicates that the card 10 was newly inserted, the insertion count value is updated incrementally. Before changing the primary counter value, however, the existing primary counter value is copied to a backup (Block 400). This is performed as a mechanism to recover the primary count if there is a catastrophic event during the update of the primary counter, which may result in loss of the primary count. The backup count is stored in non-volatile storage 24 (i.e., the EEPROM or the like).

The modification in progress flag is set (Block 500). The modification flag is used for error recovery purposes. It is set prior to incrementing the insertion counter and cleared after the primary counter has been successfully updated. This flag is also stored in non-volatile storage 24.

The primary counter value is updated by incrementally increasing the count value (Block 600). The primary counter value holds the current value of the insertion count assuming no errors have corrupted the primary count. The counter itself may consist of both hardware and software. The hardware, which may be in the form a PLD 20, 22 and non-volatile storage 24, is used to determine and store the count value. The primary counter should be provided with the ability to hold a value greater than the rated number of insertions of the connector 12. One embodiment of the invention provides this capability by specifying a multi-byte counter. Because an interruption (power loss, or other error) during the writing of the primary counter value may result in corrupt results, these recovery mechanisms are implemented to guarantee the accuracy of the increment primary count value.

The modification in progress flag is cleared (Block 700). This flag is used for error recovery purposes. It is cleared after the primary counter is successfully updated. This modification flag is stored in non-volatile storage 24.

In the event that the modification in flag is set it is because the flag was not cleared in a previous operation and potentially, the primary counter value was not successfully updated. Accordingly, the backup counter value is read (Block 800). As mentioned above, the backup counter value is stored in non-volatile storage 24. The purpose of the backup counter value is to provide a separate recovered count for comparing, and updating of the primary insertion count in the event that something catastrophic occurs during the process in incrementing the primary counter.

Then, the backup counter value is incremented (Block 900). This step causes the incremental increase in the old (backed-up) primary count value. The intent of this is to account for the insertion that occurred prior to the catastrophic event. The backup counter value is one less than the actual number of insertions and incrementing this value will give the correct insertion count.

The modified backup value is stored as the primary insertion count (Block 1000). The primary count value needs to be overwritten with a known good count value. During a catastrophic event, the primary count could have been corrupted.

The modification in progress flag is cleared (Block 1100). This flag is used for error recovery purposes. It is cleared because the primary counter has been successfully updated. This modification flag is stored in non-volatile storage 24.

After successful clearing of the modification in progress flag, the process checks to see if a new insertion is detected (Block 300). In this manner, an insertion monitoring apparatus is provided with error detection and correction which may be output to or accessed by a management entity.

While the embodiments of the invention disclosed herein are presently considered to be preferred, various changes and modifications can be made without departing from the spirit and scope of the invention. The scope of the invention is indicated in the appended claims, and all changes that come within the meaning and range of equivalents are intended to be embraced therein.

I claim:

1. A card monitoring apparatus for detecting and incrementing insertion counts of an application card to a backplane connector comprising:

a card connector positioned on the application card including connector terminals sized and shaped to connect to the backplane connector wherein the application card includes an insertion monitoring circuit connected to a subset of the connector terminals for detecting a connection of the application card to the backplane connector and generating and storing an insertion count.

2. The card monitoring apparatus of claim 1, wherein said subset of connector terminals includes:

a first conductor positioned on the application card for providing power to at least said insertion monitoring circuit; and a second conductor positioned on said application card electrically connected to said insertion monitoring circuit wherein said first conductor and said second conductor are offset with respect to each other such that during connection of said card connector with the backplane connector an insertion sequence is performed wherein said first conductor mates with the backplane connector before said second conductor, and wherein said insertion sequence is detected by said insertion monitoring circuit, which generates an incremental increase in said insertion count.

3. The card monitoring apparatus of claim 2, wherein said insertion monitoring circuit includes an insertion detection device for detecting said insertion of said card connector into the backplane connector.

4. The card monitoring apparatus of claim 3, wherein said insertion detection device generates an insertion signal when an insertion is detected.

5. The card monitoring apparatus of claim 4, wherein said insertion monitoring circuit includes a state device connected to said insertion detection device for receiving said insertion signal and performing an update of said insertion count.

6. The card monitoring apparatus of claim 5, wherein said insertion detection circuit includes a non-volatile memory device connected to said state device.

7. The card monitoring apparatus of claim 6, wherein said insertion count is stored in said non-volatile memory device.

8. The card monitoring apparatus of claim 3, wherein said second conductor includes a first sense line and a second sense line.

9. The card monitoring apparatus of claim 8, further including one or more pull up resistors connected to said first conductor.

10. The card monitoring apparatus of claim 9, wherein said insertion detection device includes a multi-input OR gate with each OR gate input connected to a corresponding one of said first and second sense lines, said OR gate having a binary output with a first state indicating a high voltage in one or both of said first and second sense lines and a second state indicating a low voltage in both of said first and second sense lines.

11. The card monitoring apparatus of claim 9, wherein said insertion detection device includes a multi-input AND gate with each AND gate input connected to a corresponding one of said first and second sense lines, said AND gate having a binary output with a first state indicating a high voltage in both of said first and second sense lines and a second state indicating a low voltage in one of said first and second sense lines.

12. The card monitoring apparatus of claim 2, wherein said first conductor is a hardware resource bus terminal.

13. A line card for use in a high availability chassis connectable thereto by a backplane connector comprising:
a connector connectable to the backplane connector, said connector including a plurality of connector terminals for transmitting electrical power and electrical signals, a subset of said plurality of connector terminals being connected to an insertion monitoring circuit of the line card, said insertion monitoring circuit including:
a power conductor connected to a first terminal of said subset;
one or more pull up resistors connected to said power conductor;
one or more sense lines connected to respective one or more second terminals of said subset, wherein said first terminal is positioned on said line card so as to be connectable to the backplane connector before said one or more second terminals;
an insertion detection device for detecting an insertion of said line card;
a state device connected to said insertion detection device for calculating a primary insertion count from said detection of said insertion; and
a non-volatile memory device connected to said state device, said non-volatile memory device for storing said primary insertion count.

14. The line card of claim 13, wherein said pull up resistors hold said insertion monitoring circuit in a high state when said first terminal is inserted into the backplane connector.

15. The line card of claim 13, wherein said one or more sense lines permit said insertion monitoring circuit to transition to a low state when one of said one or more sense lines is inserted into the backplane connector.

16. The line card of claim 13, wherein said insertion detection device detects said transition from said high state to said low state and generates an insertion signal.

17. The line card of claim 13, wherein said state device receives said insertion signal from said insertion detection device, reads a stored primary insertion count from said non-volatile memory device, incrementally increases said primary insertion count to produce an updated primary insertion count and writes the updated primary insertion count to said non-volatile memory device.

18. A system for monitoring the insertion of an application card into a backplane connector of a host system, comprising:
a female connector connected to the application card, said female connector including an insulative housing defining a space;
a male connector connected to the host system, said male connector sized and shaped to be received by said space of said female connector;
an insertion detection device connected to said female connector for detecting an insertion of said male connector into said female connector and generating and storing an insertion count therefrom; and
a plurality of conductive terminals extending from said female connector for electrical communication with the backplane connector including a first conductor positioned on the application card for providing power to at least said insertion detection device and a second conductor positioned on said application card electrically connected to said insertion detection device, wherein said first conductor and said second conductor are offset with respect to each other such that during insertion of the application card into the backplane connector an insertion sequence is performed wherein said first conductor mates with the backplane connector before said second conductor, and wherein said insertion sequence causes an incremental increase in said insertion count.

19. A card monitoring apparatus for detecting and incrementing insertion counts of a line card to a backplane connector in a host system comprising:
a card connector positioned on the line card including connector terminals sized and shaped to be connected to the backplane connector wherein the line card includes an insertion detection circuit connected to a subset of the connector terminals for detecting an insertion of said line card with said backplane connector and calculating and storing an insertion count therefrom.

20. A host system comprising:

a plurality of line cards, each of said plurality of line cards including a monitoring apparatus for detecting and incrementing insertion counts to one of a plurality of backplane connectors of a high availability chassis of the host system, wherein each of said plurality of line cards includes a card connector with connector terminals sized and shaped to be connected to one of said plurality of backplane connectors, and wherein said monitoring apparatus includes an insertion detection circuit connected to a subset of the connector terminals for detecting an insertion of a corresponding one of said plurality of line cards with one of said plurality of backplane connectors and determining and storing an insertion count therefrom.

21. A method of generating an insertion count of a line card to a backplane connector comprising:

providing the line card with an insertion monitoring circuit for detecting, incrementing and storing the insertion count;

connecting a first terminal of said insertion monitoring circuit to the backplane connector to produce a high state;

connecting a second terminal of said insertion monitoring circuit to the backplane connector to transition said high state to a low state;

detecting the transition to said low state;

retrieving a current primary insertion count in response to said detection of the transition;

incrementing said current primary insertion count to produce an updated primary insertion count; and storing said updated primary insertion count as the current primary insertion count.

22. The method of claim 21, further including providing said current primary insertion count to a management entity for monitoring purposes.

23. The method of claim 21, further including providing the line card insertion monitoring circuit with an error detection and correction method.

24. A method of generating a removal count of a line card from a backplane connector comprising:

providing the line card with a removal monitoring circuit for detecting, incrementing and storing the removal count;

maintaining said removal monitoring circuit at a low state;

removing a first terminal of said removal monitoring circuit from the backplane connector;

removing a second terminal of said removal monitoring circuit from the backplane connector to transition said low state to a high state;

detecting the transition to said high state;

retrieving a current primary removal count in response to said detection of the transition;

incrementing said current primary removal count to produce an updated primary removal count; and storing said updated primary removal count as the current primary removal count.

\* \* \* \* \*